United States Patent
Freyman et al.

(10) Patent No.: US 7,495,494 B2
(45) Date of Patent: Feb. 24, 2009

(54) PARALLEL TRIMMING METHOD AND APPARATUS FOR A VOLTAGE CONTROLLED DELAY LOOP

(75) Inventors: Ronald L. Freyman, Bethlehem, PA (US); Mohammad S. Mobin, Orefield, PA (US); Vladimir Sindalovsky, Perkasie, PA (US); Lane A. Smith, Easton, PA (US)

(73) Assignee: Agere Systems Inc., Allentown, PA (US)

( * ) Notice: Subject to any disclaimer, the term of this patent is extended or adjusted under 35 U.S.C. 154(b) by 183 days.

(21) Appl. No.: 11/141,703

(22) Filed: May 31, 2005

(65) Prior Publication Data

US 2006/0267657 A1 Nov. 30, 2006

(51) Int. Cl.
*H03H 11/26* (2006.01)
(52) U.S. Cl. ...................... 327/270; 327/149
(58) Field of Classification Search ......... 327/240–272, 327/276–278, 284, 149, 158, 161; 331/17, 331/25, 46, 57, DIG. 2; 375/373–376
See application file for complete search history.

(56) References Cited

U.S. PATENT DOCUMENTS

| | | | |
|---|---|---|---|
| 5,101,117 A * | 3/1992 | Johnson et al. | 327/149 |
| 6,249,166 B1 * | 6/2001 | Jensen et al. | 327/276 |
| 6,329,854 B1 * | 12/2001 | Lee et al. | 327/158 |
| 6,366,148 B1 * | 4/2002 | Kim | 327/262 |
| 6,784,714 B2 * | 8/2004 | Nakamura | 327/271 |
| 6,943,602 B1 * | 9/2005 | Lee | 327/158 |
| 7,176,737 B2 * | 2/2007 | Baker et al. | 327/280 |
| 2004/0052323 A1 * | 3/2004 | Zhang | 375/375 |
| 2006/0001449 A1 * | 1/2006 | Bhattacharya et al. | 326/81 |

* cited by examiner

*Primary Examiner*—Lincoln Donovan
*Assistant Examiner*—Thomas J Hiltunen
(74) *Attorney, Agent, or Firm*—Ryan, Mason & Lewis, LLP

(57) ABSTRACT

A parallel trimming method and apparatus are provided for a voltage controlled delay loop. A plurality of delay units in a voltage controlled delay loop are trimmed. Each delay unit comprises a delay element and a latch buffer. A reference signal is applied to each of the delay units and a position of an edge (such as a rising or falling edge) associated with each of the delay units is identified. The edges of the delay units are then aligned by adjusting a trim setting of the respective latch buffer.

24 Claims, 3 Drawing Sheets

PARALLEL TRIMMING METHOD AND APPARATUS FOR A VOLTAGE CONTROLLED DELAY LOOP

CROSS-REFERENCE TO RELATED APPLICATIONS

The present invention is related to U.S. patent application Ser. No. 11/020,022, entitled, "Trimming Method and Apparatus for Voltage Controlled Delay Loop with Central Interpolator," incorporated by reference herein.

FIELD OF THE INVENTION

The present invention is related to techniques for clock and data recovery (CDR) and, more particularly, to methods and apparatus for digital control of the generation and selection of different phases of a clock signal.

BACKGROUND OF THE INVENTION

In many applications, including digital communications, clock and data recovery (CDR) must be performed before data can be decoded. Generally, in a digital clock recovery system, a reference clock signal of a given frequency is generated together with a number of different clock signals having the same frequency but with different phases (also known as a multi-phase clock). In one typical implementation, the different clock signals are generated by applying the reference clock signal to a delay network. Thereafter, one or more of the clock signals are compared to the phase and frequency of an incoming data stream and one or more of the clock signals are selected for data recovery.

A number of existing digital CDR circuits use voltage controlled delay loops (VCDL) to generate a number of clocks having the same frequency and different phase for data sampling (i.e., oversampling). For example, published International Patent Application No. WO 97/14214, discloses a compensated delay locked loop timing vernier. The disclosed timing vernier produces a set of timing signals of similar frequency and evenly distributed phase. An input reference clock signal is passed through a succession of delay stages. A separate timing signal is produced at the output of each delay stage. The reference clock signal and the timing signal output of the last delay stage are compared by an analog phase lock controller. The analog phase lock controller controls the delay of all stages so that the timing signal output of the last stage is phase locked to the reference clock. Based on the results of the oversampled data, the internal clock is delayed so that it provides data sampling adjusted to the center of the "eye." The phase of the VCDL is adjusted to keep up with phase deviations of the incoming data.

While such voltage controlled delay loops effectively generate the sampling clocks and control the delay stages to maintain alignment of the reference clock signal and the last timing signal, they suffer from a number of limitations, which if overcome, could further improve the utility of such voltage controlled delay loops. For example, when the voltage controlled delay loops are implemented using integrated circuit technology, an inherent mismatch exists between the various delay stages, causing uneven phase distribution of the multiphase clock in the generated phases of the clock sources. It has been found that even a small processing mismatch can cause a large percentage mismatch in design output variability.

U.S. patent application Ser. No. 11/020,022, entitled, "Trimming Method and Apparatus for Voltage Controlled Delay Loop with Central Interpolator," discloses methods and apparatus for trimming a desired delay element in a voltage controlled delay loop. While the disclosed trimming process ensures that the delay provided by each delay element in the VCDL loop are the same, each delay element has an associated latch buffer that may not be the same.

A need therefore exists for a trimming method for a voltage controlled delay loop that compensates for such mismatched latch buffers.

SUMMARY OF THE INVENTION

Generally, a parallel trimming method and apparatus are provided for a voltage controlled delay loop. According to one aspect of the invention, a plurality of delay units in a voltage controlled delay loop are trimmed. Each delay unit comprises a delay element and a latch buffer. A reference signal, for example, from a central interpolator, is applied to each of the delay units and a position of an edge associated with each of the delay units, such as a rising or falling edge, is identified. The edges of the delay units are then aligned by adjusting a trim setting of the respective latch buffer.

The edge associated with each of the delay units can optionally be aligned to an edge of a second reference signal, for example, from a source of phase controlled data, such as a roaming tap interpolator. The edges of the delay units can be identified, for example, by applying a known signal to a data latch and determining if the edges associated with each of the delay units is to the left or right of an edge of the known signal.

A more complete understanding of the present invention, as well as further features and advantages of the present invention, will be obtained by reference to the following detailed description and drawings.

DETAILED DESCRIPTION

Figure 1:
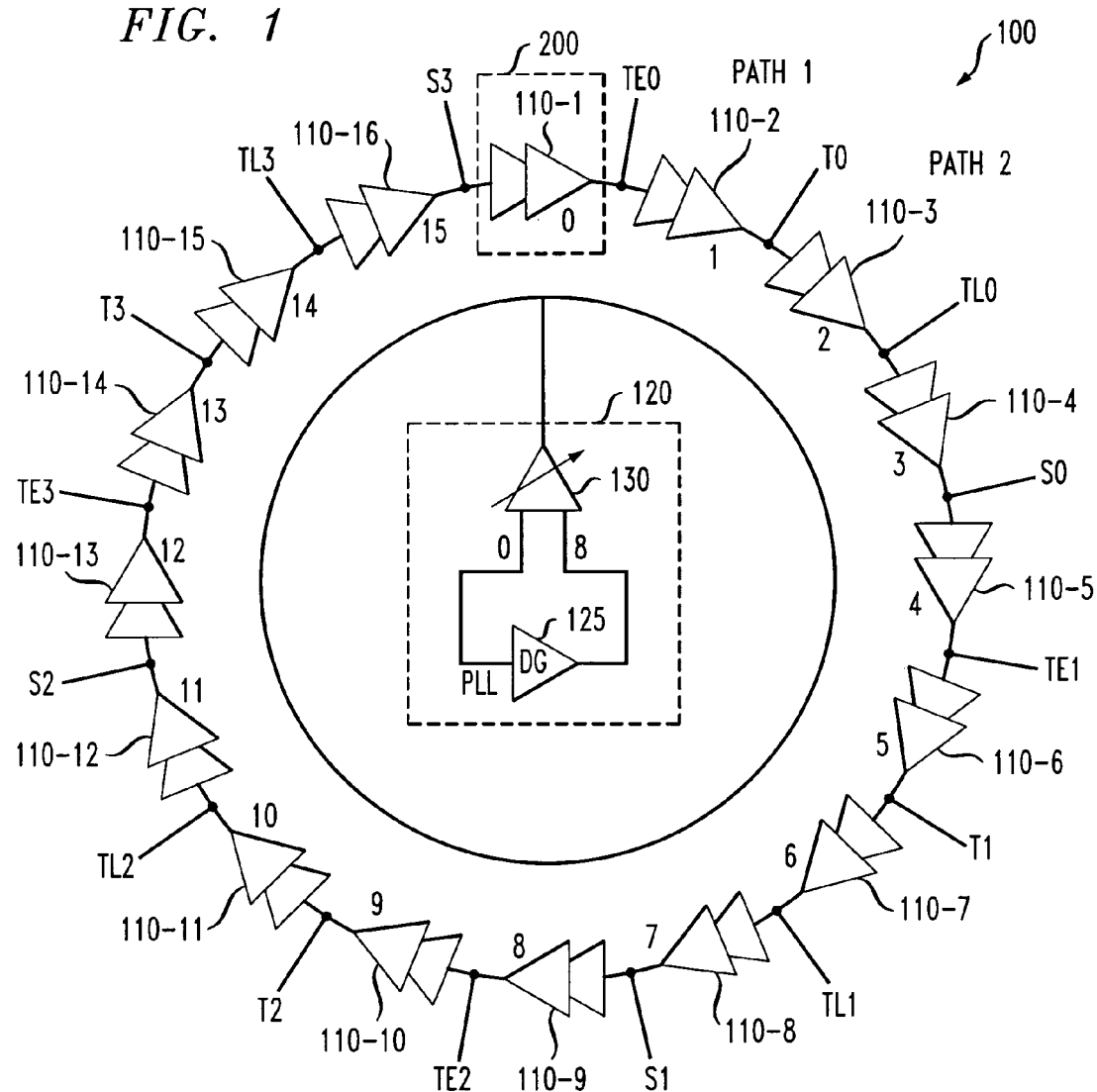
FIG. 1 illustrates an exemplary VCDL in which the present invention can operate.

The present invention provides a parallel trimming method for voltage controlled delay loops with digital phase control. FIG. 1 illustrates an exemplary VCDL 100 in which the present invention can operate. The exemplary VCDL 100 provides a coarse phase control using injection point control techniques, as well as a fine phase control provided by a central interpolator 120. The VCDL 100 is comprised of a plurality of delay elements 110-1 through 110-16 interconnected in a loop. An exemplary delay element 110-1 is discussed further below in conjunction with FIG. 2. Generally, each delay element 110 can select as an input the output of the central interpolator 120 or the output of the previous delay element 110 in the loop.

Thus, a PLL signal that is injected into the VCDL 100 is first interpolated by the central interpolator 120 to provide fine phase control. Following the fine phase control, the injection point may optionally be adjusted into any delay element 110 to provide a coarse phase control, using the approach of FIGS. 1 and 2. For a detailed discussion of injection point control and central interpolation techniques, see U.S. patent application Ser. No. 11/020,022, entitled, "Trimming Method and Apparatus for Voltage Controlled Delay Loop with Central Interpolator," or U.S. patent application Ser. No. 10/999, 889, entitled, "Voltage Controlled Delay Loop with Central Interpolator," incorporated by reference herein.

The exemplary central interpolator 120 receives an input PLL signal, for example, having a frequency of 1-3 GHz, which is applied to a delay stage 125 having one or more delay elements (e.g., each providing a ¼ UI delay). For a discussion of a unit interval (UI) delay with respect to a data eye, where a UI is defined as a distance between two adjacent transition points, see U.S. patent application Ser. No. 11/020,022 or Ser. No. 10/999,889. The delay stage 125 is connected to the central interpolator 130 such that the left and right inputs to the central interpolator 130 are separated by at least one delay element, as shown in FIG. 1.

The exemplary central interpolator 130 provides a number, such as 8, distinct phases (over ¼ UI range), between each coarse phase setting. The central interpolator 130 changes the interpolation phase, for example, under control of the circuitry responsible for maintaining phase lock to incoming serial data. If the phase must be adjusted beyond the range provided by the central interpolator 130 (i.e., more than a ¼ UI), then a coarse phase adjustment is made by adjusting the injection point (providing a granularity of ¼ UI).

The exemplary VCDL 100 provides a different clock signal at the output TE0, T0, . . . S3 of each delay element 110, each clock signal having the same frequency but a different phase.

Figure 2:
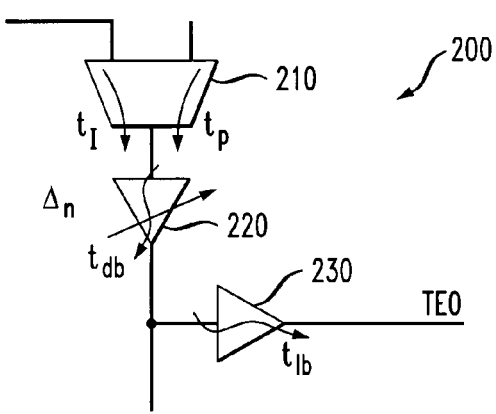
FIG. 2 is a block diagram illustrating an exemplary delay element of FIG. 1 in further detail.

FIG. 2 is a block diagram 200 illustrating the exemplary delay element 110-1 of FIG. 1 in further detail. As shown in FIG. 2, the delay element 110-1 comprises a multiplexer 210, a delay element 220 and a latch buffer 230. The multiplexer 210 selects the output of the central interpolator 120 or the output of the previous delay element 110 in the loop. Typically, in a normal operating mode, only one delay element 110 in the VCDL 100 selects the output of the central interpolator 120 (i.e., the injection point) and the remaining delay elements 110 select the output of the previous delay element 110 in the loop. For example, in a normal operation mode, the VCDL delay elements can provide 40 ps delay @ a 6.25 Gbps rate. Ideally, these equally spaced delays provide high speed multi-phase sampling clocks derived out of a same speed clock source. In a parallel trim mode in accordance with the present invention, however, each delay element 110 in the VCDL 100 selects the output of the central interpolator 120.

It has been found that each delay element 200 will assert delays uncorrelated to other delay elements 200 in the VCDL 100 giving rise to non-equal phase delays from one delay element 100 to another. In particular, the following parameters of a given delay element 200 may vary from another delay element 110 as follows:

delay through regular MUX path (from previous delay element)=$t_p$;

delay through injection path (from central interpolator 120)=$t_I$;

delay through delay element 220=$t_{db}$; and delay through the latch buffer 230=$t_{lb}$.

According to one aspect of the invention, a parallel trimming method is provided for matching the delay through the delay element 200 for each of the delay elements 110 in the VCDL 100. Generally, the disclosed parallel trimming method matches the following delay path:

Parallel trim delay path=$t_{In}+t_{dbn}+t_{lbn}$

In a parallel trim mode, the same clock is injected, for example, from the central interpolator 120, to each delay element 200. Once the parallel injection is enabled, the clock phases out of all delay elements 110 will be adjusted such that they are aligned to each other. The delay in all delay elements 220 and their associated multiplexers 210 and latch buffers 230 all contribute to the delay and can be equalized with respect to injection point of entry. It is assumed that the delay, $t_I$, through the injection point input to the multiplexers 210 and the regular delay input, $t_p$, to the MUX would be comparable. In the exemplary embodiment, it is assumed that the variation of the delay through the delay elements 220 and multiplexers 210 will be small. Thus, the disclosed parallel trim technique only trims the latch buffer delay, but it can also compensate for the difference in delays through elements 210 and 220.

A technique for trimming the delay element 220 is discussed in U.S. patent application Ser. No. 11/020,022, entitled, "Trimming Method and Apparatus for Voltage Controlled Delay Loop with Central Interpolator."

Figure 3:
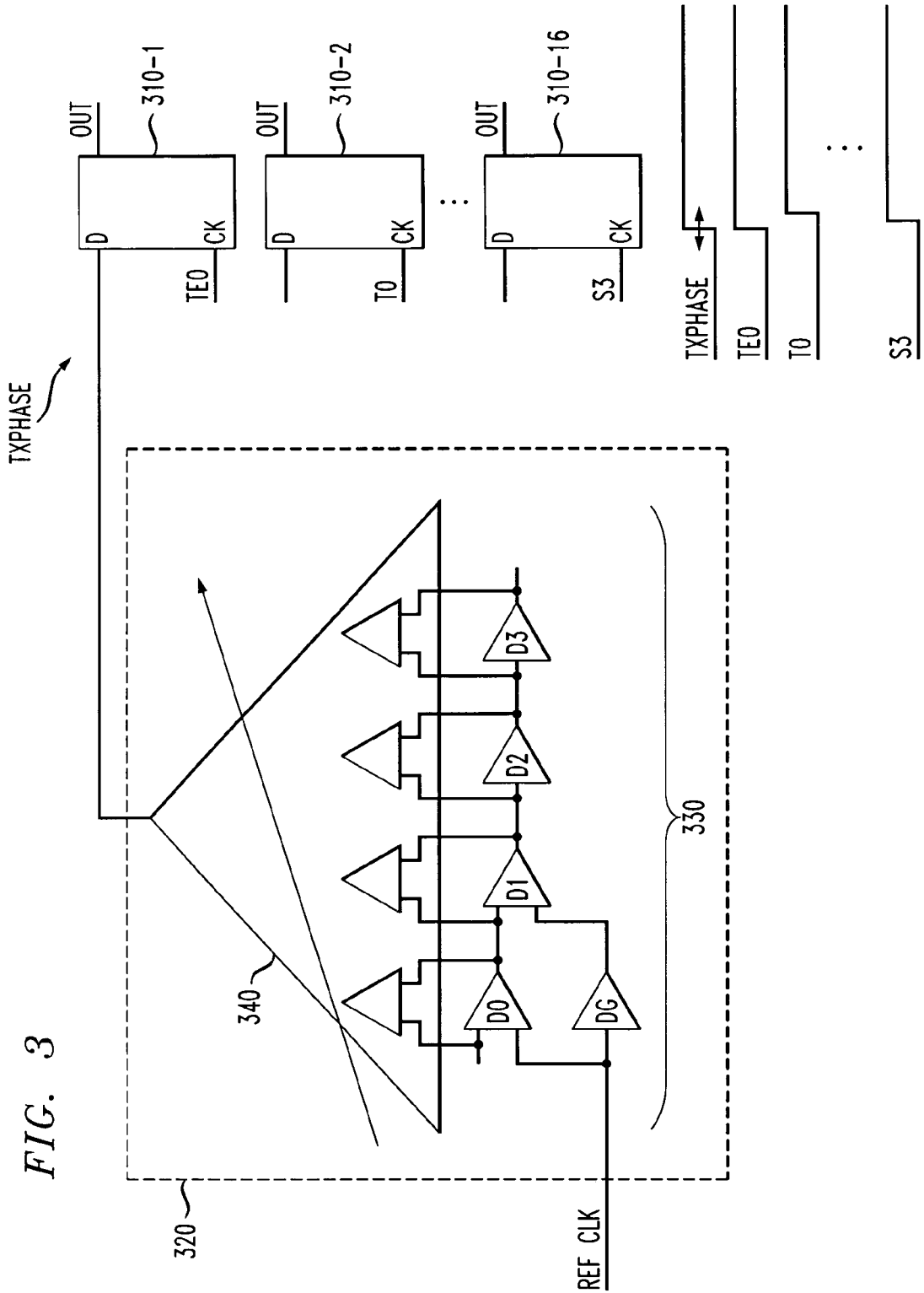
FIG. 3 is a schematic block diagram illustrating how the phase offset signals generated by a VCDL may be employed by a number of latches.

FIG. 3 is a schematic block diagram illustrating how the phase offset signal generated by an independent signal source 320 may be employed by a number of latches 310-1 through 310-16, for example, as the sample data. As shown in FIG. 3, the output of each delay element 110, such as the output TE0 of delay element 110-1, drives the clock input of a corresponding latch 310. In addition, the D input of each latch 310, which is normally connected to the receive serial data, in the trim mode is driven by a source of phase controlled data 320. In the exemplary embodiment, the source of phase controlled data 320 is embodied as a roaming tap interpolator, such as those described in U.S. patent application Ser. No. 11/020, 021, entitled, "Phase Interpolator Having A Phase Jump," incorporated by reference herein. The source of phase controlled data 320 provides a clock signal whose phase can be independently adjusted with respect to the latch clock phase.

As shown in FIG. 3, the source of phase controlled data 320 receives a reference clock signal, such as a bit clock, for example, from a PLL, that is applied to a delay bank 330. The delay bank 330 is comprised of a number of delay elements. The delay elements in the delay bank 330 produce multiple clock phases which can be interpolated so that the phase can be moved to any phase within the period of the bit clock. The bit clock period is typically divided into several regions. In the exemplary embodiment shown in FIG. 3, the delay bank 330 can be tapped at four different locations to provide four corresponding interpolation regions.

Each region is separately selected by a multiplexer (not shown) and separately interpolated by the interpolator 340, in a known manner. When the boundary of an interpolation region is reached, the interpolator 320 switches to the adjacent region.

Thus, in the exemplary embodiment, a phase adjustable clock source 320 provides the data source for the latches 310. In the parallel trim mode, the output of the central interpolator 120 is injected to all delay elements 110 simultaneously. The resulting clock delay of each clock path is then aligned against the rising edge of the phase adjustable clock source 320. The phase adjustable clock source 320 is sampled with the latch clocks.

In the parallel injection mode, the output of the central interpolator 120 feeds the input to all delay elements 110. As a result, all delay elements 110 will output the injected central interpolator output plus the variability in the multiplexer 210, delay element 220 and the latch buffer 230. The objective is to adjust all outputs using the disclosed latch buffer trim such that all outputs line up to the clock edge of the clock source 320 within the phase quantizer resolution of the clock source 320.

As discussed further below in conjunction with FIG. 4, the parallel trimming technique of the present invention aligns the rising edge of the output TE0, T0, . . . S3 of each delay element 110 of the VCDL 100 to the rising edge of the adjustable phase clock source 320 (TXPHASE). In the exemplary embodiment, the phase of the adjustable phase clock source 320 is adjusted between a minimum and maximum phase value and is applied to the D input of the latches 310 that are each clocked by a respective phase applied to the clock input. In this manner, the rising edge of the clock source 320 is varied between the minimum and maximum phase value.

When the rising edge of the clock source 320 is at a minimum value, most or all of the latches 310 will sample a binary value of one (1). As the rising edge of the clock source 320 is moved to the right, as the phase of the clock source 320 is increased, the point at which each latch detects a transition from a binary value of one (1) to a binary value of zero (0) can be detected. Thus, based on the current trim settings, the location of the rising or falling edge (i.e., the position that causes a transition from a binary value of one (1) to a binary value of zero (0) or vice versa) associated with each delay element 110 can be identified. The trim setting 230 for each latch buffer is capable of increasing or decreasing the propagation delay through the buffer 230. For example, when the trim value is decreased, the propagation delay increases, and vice versa.

Thereafter, the mean position for all delay elements 110 can be identified and the adjustable clock source 320 can be set to the mean value. In this manner, the rising edge of the clock source 320 is positioned near the rising edge of most data latch clocks.

Figure 4:
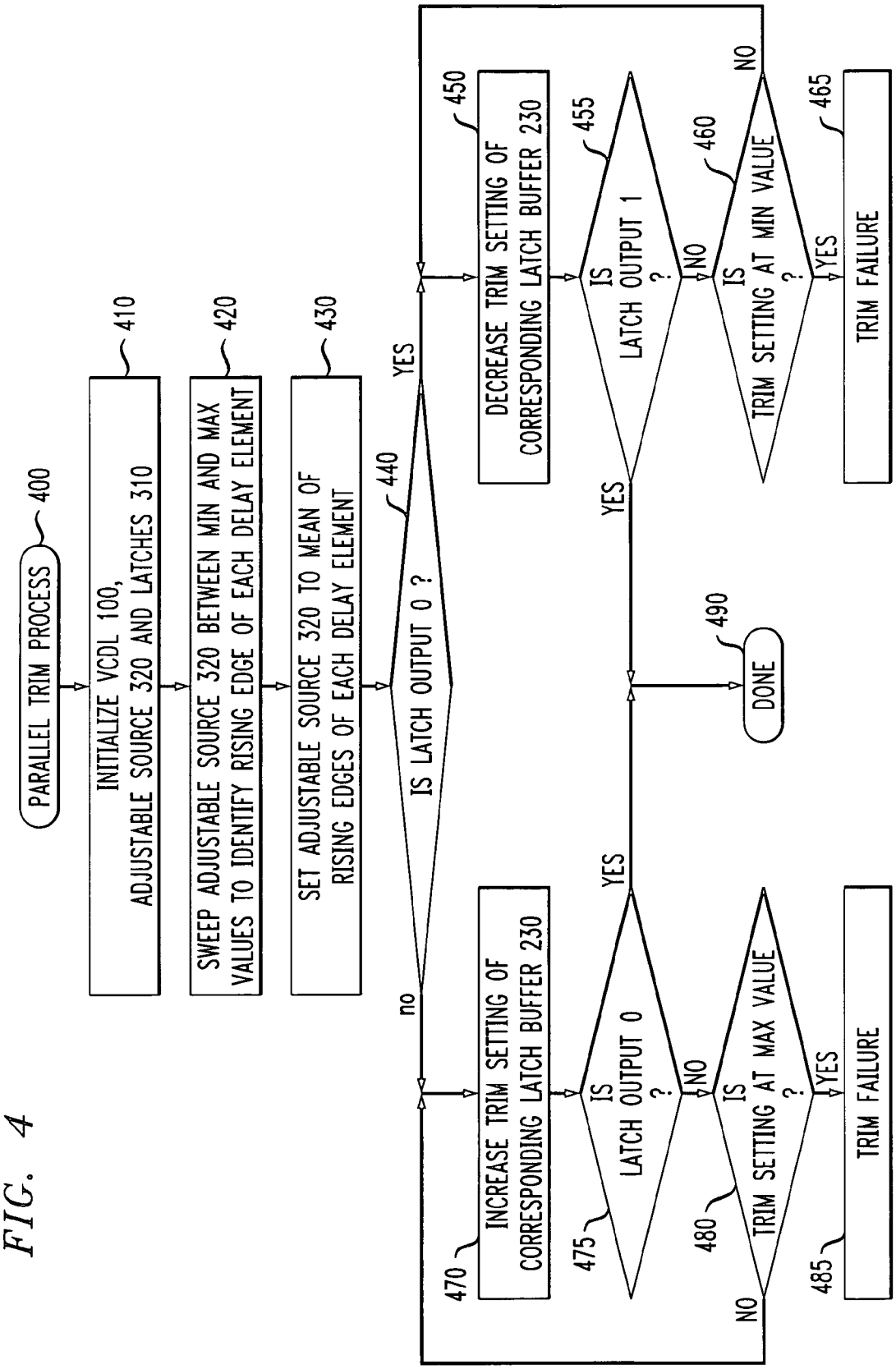
FIG. 4 is a flow chart describing an exemplary implementation of a parallel trim process incorporating features of the present invention.

FIG. 4 is a flow chart describing an exemplary implementation of a parallel trim process 400 incorporating features of the present invention. As shown in FIG. 4, the parallel trim process 400 initializes the VCDL 100, adjustable clock source 320 and the latches 310, during step 410. It is noted that the central interpolator 120 is kept at a fixed setting.

Thereafter, the phase of the adjustable clock source 320 is varied between a minimum and maximum value to identify the position of the rising edge of each delay element 110 during step 420. The adjustable clock source 320 is then set to the mean value of the rising edges of each delay element 110 during step 430.

A test is performed during step 440 for each delay element to determine if the corresponding latch output is 0. If it is determined during step 440 that the corresponding latch output is 0, then the trim setting of the corresponding latch buffer 230 is decreased during step 450. In other words, if a latch has an output of zero (0), the output of the associated data element is on the left of the rising edge of the adjustable clock source 320, and the trim setting of the latch buffer 230 is adjusted (e.g., decreased) to move the output of the associated data element 110 to the right during steps 450-465. The trim setting is gradually adjusted (decreased) in the manner described above until a binary value of 1 is obtained at the output of the latch (i.e., until the trim process crosses a rising edge).

A further test is performed during step 455 for the current delay element to determine if the latch output is 1. If it is determined during step 455 that the corresponding latch output is 1, then the delay element 110 has been successfully trimmed and program control proceeds to step 490. If, however, it is determined during step 455 that the corresponding latch output is not yet 1, then a further test is performed during step 460 for the current delay element to determine if the trim setting of the corresponding latch buffer 230 is at a minimum value during step 460. If the trim setting of the corresponding latch buffer 230 is not at a minimum value, program control returns to step 450 to further adjust the trim setting. If, however, the trim setting of the corresponding latch buffer 230 is at a minimum value, then a trim failure is identified during step 465 and program control terminates.

If, however, it was determined during step 440 that the corresponding latch output is 1, then the trim setting of the corresponding latch buffer 230 is increased during step 470. A further test is performed during step 475 for the current delay element to determine if the latch output is 0. If it is determined during step 475 that the corresponding latch output is 0, then the delay element 110 has been successfully trimmed and program control proceeds to step 490. If, however, it is determined during step 475 that the corresponding latch output is not yet 0, then a further test is performed during step 480 for the current delay element to determine if the trim setting of the corresponding latch buffer 230 is at a maximum value during step 480. If the trim setting of the corresponding latch buffer 230 is not at a maximum value, program control returns to step 470 to further adjust the trim setting. If, however, the trim setting of the corresponding latch buffer 230 is at a maximum value, then a trim failure is identified during step 485 and program control terminates.

Following execution of the parallel trim process 400, each of the latch buffers 230 associated with the delay elements 110 have been trimmed to within one least significant bit (LSB of the trim control) of the rising edge of the adjustable clock source 320.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

We claim:

1. A method for trimming a plurality of delay units in a voltage controlled delay loop, each of said delay units comprised of a delay element and a latch buffer, said method comprising the steps of:

selectively applying a reference signal to each of said delay units;

identifying a position of an edge associated with each of said delay units;

latching a delayed version of said reference signal; and aligning said edge associated with each of said delay units.

2. The method of claim 1, wherein said reference signal is generated by a central interpolator.

3. A method for trimming a plurality of delay units in a voltage controlled delay loop, each of said delay units comprised of a delay element and a latch buffer, said method comprising the steps of:

selectively applying a reference signal to each of said delay units;

identifying a position of an edge associated with each of said delay units; and aligning said edge associated with each of said delay units, wherein said aligning step further comprises the step of aligning said edge associated with each of said delay units to an edge of a second reference signal.

4. The method of claim 3. wherein said second reference signal is generated by a source of phase controlled data.

5. The method to claim 4, further comprising the steps of determining a mean position of said edges associated with each of said delay units and setting said source of phase controlled data to said mean position.

6. The method of claim 4, wherein said source of phase controlled data is a roaming tap interpolator.

7. A method for trimming a plurality of delay units in a voltage controlled delay loop, each of said delay units comprised of a delay element and a latch buffer, said method comprising the steps of:
selectively applying a reference signal to each of said delay units;
identifying a position of an edge associated with each of said delay units; and
aligning said edge associated with each of said delay units, wherein said identifying step further comprises the step of applying a known signal to a data latch and determining if said edges associated with each of said delay units is to the left or right of an edge of said known signal.

8. The method of claim 1, wherein said aligning step further comprises the step of adjusting a trim setting of said latch buffer.

9. The method of claim 1, wherein an output of said voltage controlled delay loop is used for clock and data recovery.

10. The method of claim 1, wherein said edge is a rising edge or a falling edge.

11. A voltage controlled delay loop, comprising:
a central interpolator for generating a reference clock;
a plurality of delay units connected in series, each of said delay units comprised of a delay clement and a latch buffer, whereby an output of said central interpolator is selectively injected into any one or more of said plurality of delay elements; and
a data latch associated with each of said plurality of delay units to identify a position of an edge associated with each of said delay units, whereby said edge associated with each of said delay units is aligned to one another.

12. The voltage controlled delay loop of claim 11, wherein each of said delay units further comprises a multiplexer for selecting the output of said central interpolator or the output of a previous delay unit in said loop.

13. The voltage controlled delay loop of claim 11, wherein an edge associated with each of said delay units is aligned to an edge of a second reference signal.

14. The voltage controlled delay loop of claim 13, wherein said second reference signal is generated by a source of phase controlled data.

15. The voltage controlled delay loop of claim 11, wherein a known signal is applied to said data latch to determine if said edges associated with each of said delay units is to the left or right of an edge of said known signal.

16. The voltage controlled delay loop of claim 11, wherein a trim setting of said latch buffers are adjusted based on said alignment of said edges.

17. The voltage controlled delay loop of claim 11, wherein said edge is a rising edge or a falling edge.

18. An integrated circuit, comprising:
a voltage controlled delay loop, comprising:
a central interpolator for generating a reference clock;
a plurality of delay units connected in series, each of said delay units comprised of a delay element and a latch buffer, whereby an output of said central interpolator is selectively injected into any one or more of said plurality of delay elements; and
a data latch associated with each of said plurality of delay units to identify a position of an edge associated with each of said delay units, whereby said edge associated with each of said delay units is aligned to one another.

19. The integrated circuit of claim 18, wherein each of said delay units further comprises a multiplexer for selecting the output of said central interpolator or the output of a previous delay unit in said loop.

20. The integrated circuit of claim 18, wherein an edge associated with each of said delay units is aligned to an edge of a second reference signal.

21. The integrated circuit of claim 20, wherein said second reference signal is generated by a source of phase controlled data.

22. The integrated circuit of claim 18, wherein a known signal is applied to said data latch to determine if said edges associated with each of said delay units is to the left or right of an edge of said known signal.

23. The integrated circuit of claim 18, wherein a trim setting of said latch buffers are adjusted based on said alignment of said edge.

24. The integrated circuit of claim 18, wherein said edge is a rising edge or a falling edge.

* * * * *